United States Patent
Hauger

(10) Patent No.: US 7,289,007 B2
(45) Date of Patent: Oct. 30, 2007

(54) TEMPERATURE COMPENSATED VARIABLE TILT EQUALIZER

(75) Inventor: Michael Edward Hauger, Pennsauken, NJ (US)

(73) Assignee: General Instrument Corporation, Horsham, PA (US)

(*) Notice: Subject to any disclaimer, the term of this patent is extended or adjusted under 35 U.S.C. 154(b) by 731 days.

(21) Appl. No.: 10/757,190

(22) Filed: Jan. 14, 2004

(65) Prior Publication Data

US 2005/0153656 A1    Jul. 14, 2005

(51) Int. Cl.
*H04B 3/04* (2006.01)

(52) U.S. Cl. .................. 333/28 R; 333/18
(58) Field of Classification Search .......... 333/28 R, 333/18
See application file for complete search history.

(56) References Cited

U.S. PATENT DOCUMENTS 3,569,869 A * 3/1971 Sutton et al. .............. 333/16
4,208,640 A * 6/1980 van der Meijs ............ 333/18

* cited by examiner

*Primary Examiner*—Stephen E. Jones
(74) *Attorney, Agent, or Firm*—Larry T. Cullen

(57) ABSTRACT

A temperature compensated variable tilt equalizer configured to operate over a defined frequency range. The equalizer includes an RF input, an automatic temperature compensation circuit and a manual alignment circuit. The RF input receives an RF signal having a wide passband. The automatic temperature compensation circuit has an adjustable compensation range used to correct temperature-related tilt variances that occur on the passband of the RF signal over the defined frequency range. The manual alignment circuit is used to manually adjust tilt of the passband of the RF signal over the defined frequency range at a normal temperature. The variable tilt equalizer does not require a power source other than the RF signal.

16 Claims, 1 Drawing Sheet

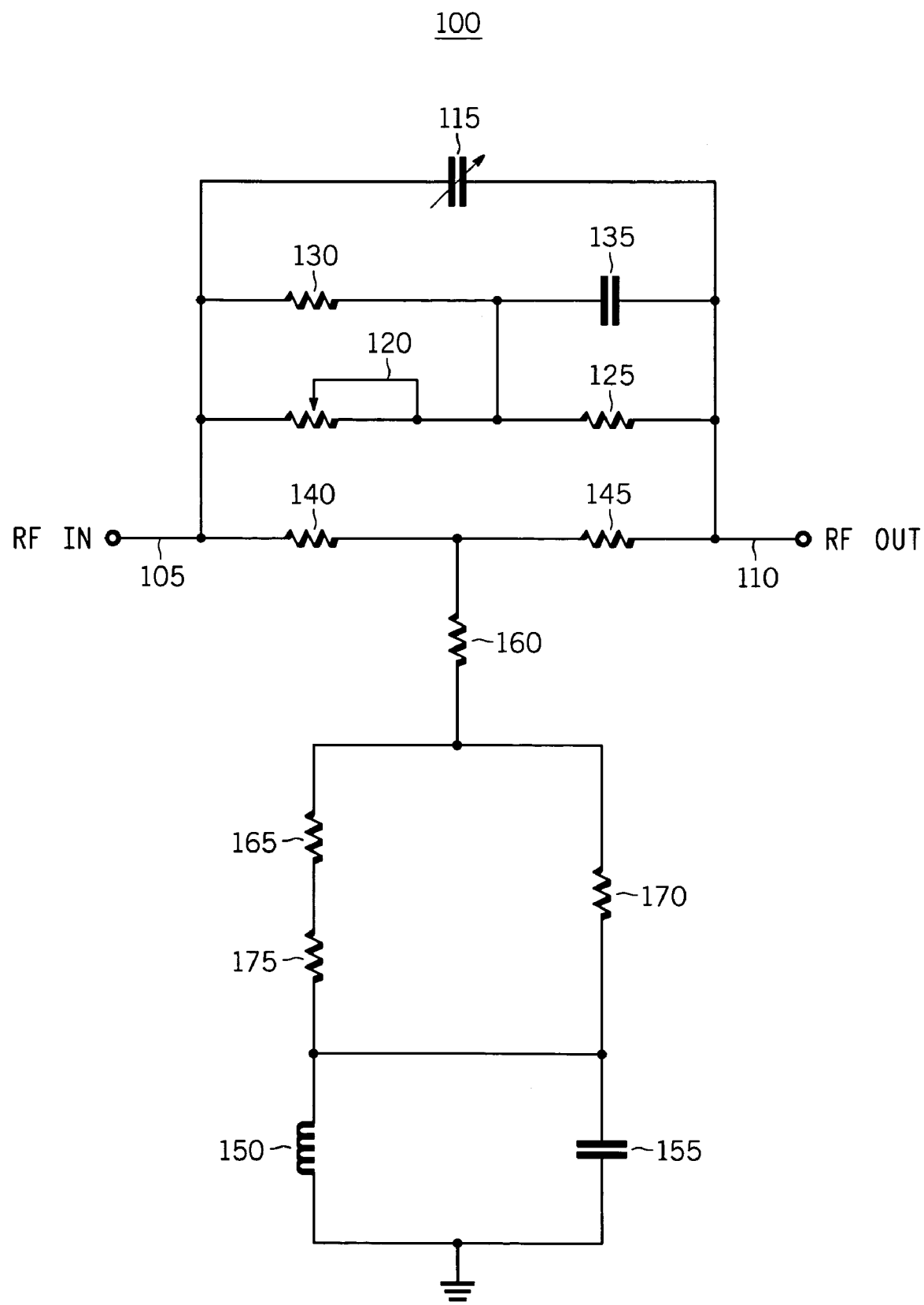

TEMPERATURE COMPENSATED VARIABLE TILT EQUALIZER

FIELD OF THE INVENTION

The present invention relates to adjusting the frequency response of radio frequency (RF) signals in a communications system. More particularly, the present invention relates to an equalizer which compensates for a tilt in an RF passband.

BACKGROUND

It has been known that, in a long-distance coaxial transmission line, the line loss generally increases with frequency. Thus, equalizers are inserted into suitable portions of such a transmission line for flattening the amplitude-frequency characteristics thereof, and it is desirable to make the equalizer controllable. Conventional equalizers are used to restore signals to their original signal amplitude level after being transmitted over a cable within a wideband RF range. During operation, the cable is subjected to different cable temperatures within a certain cable temperature range.

Conventional equalizers which are used to compensate for temperature changes which affect amplitude-frequency characteristics over a wideband RF range are usually complicated in design, and typically incorporate transistors which require an external power source. Thus, the reliability of such equalizers is questionable because they are subject to power failure or other failures due to the nature of the complicated design.

SUMMARY OF THE INVENTION

The present invention is a passive temperature compensated variable tilt equalizer which does not use any transistors or other "active" components that require an external power source other than an RF passband that is input therein.

In one embodiment, the temperature compensated variable tilt equalizer is configured to operate over a defined frequency range. The equalizer includes an RF input, an automatic temperature compensation circuit and a manual alignment circuit. The RF input receives an RF signal having a wide passband. The automatic temperature compensation circuit has an adjustable compensation range used to correct temperature-related tilt variances that occur on the passband of the RF signal over the defined frequency range. The manual alignment circuit is used to manually adjust the tilt of the passband of the RF signal over the defined frequency range at a normal temperature. The variable tilt equalizer does not require a power source other than the RF signal.

The manual alignment circuit may include a variable capacitor coupled to a variable resistor. The manual alignment circuit may provide a manual passband tilt adjustment range of approximately 2.0 dB.

The temperature compensated variable tilt equalizer may further include a limiting circuit for limiting the range of the variable resistor in the manual alignment circuit to prevent extreme settings. The limiting circuit may included a first resistor connected in parallel with the variable resistor of the manual alignment circuit, and a second resistor coupled in series with the first resistor and the variable resistor.

The automatic temperature compensation circuit may include a negative coefficient thermistor having a resistance that varies with temperature to produce a correction for temperature-related passband tilt changes provided by the equalizer.

The temperature compensated variable tilt equalizer may further include a tuning circuit which is resonant at a frequency above the highest operating frequency of the equalizer. The tuning circuit produces a constant low loss at the highest operating frequency and an accurate response shape of the passband of the RF signal over the defined frequency range. The tuning circuit may include a fixed capacitor connected in parallel with a fixed inductor, one end of the tuning circuit being connected to ground and the other end being connected to the automatic temperature compensation circuit.

The defined frequency range of the temperature compensated variable tilt equalizer may be approximately 47 MHz to 870 MHz.

BRIEF DESCRIPTION OF THE DRAWING

A more detailed understanding of the invention may be had from the following description of a preferred example, given by way of example and to be understood in conjunction with the accompanying drawing wherein:

FIG. 1 is a schematic diagram of a temperature compensated variable tilt equalizer circuit operating in accordance with a preferred embodiment of the present invention.

DETAILED DESCRIPTION OF THE PREFERRED EMBODIMENT

The preferred embodiment will be described with reference to the drawing figures wherein like numerals represent like elements throughout.

The present invention provides a temperature compensated variable tilt equalizer that reduces the variation in RF frequency response (i.e., loss or gain), usually referred to as "tilt, due to variations in the RF characteristics of passive and active devices in an RF path connected to an input of the equalizer. Preferably, the RF passband inputted into the equalizer has a range from approximately 47 MHz to 870 MHz. Thus, the equalizer allows for changes in tilt over temperature to be compensated for and allows the actual amount of tilt to be adjusted.

The present invention may be incorporated into a broadband cable transmission system comprising many active and passive components connected in cascade. These may include optical transmitters and receivers, RF amplifiers, splitters, couplers and the optical fiber and/or coaxial paths that interconnect the components.

FIG. 1 shows a circuit for a temperature compensated variable tilt equalizer 100. The equalizer 100 is designed with a thermistor network which serves as automatic temperature compensation circuit. The thermistor network has an adjustable compensation range that can provide up to approximately 2.0 dB of tilt correction over temperature. The circuit of the equalizer 100 maintains close to a "flat" change over temperature. Without the equalizer 100, tilt is subject to a variation of approximately 2.0 dB over the temperature extremes, with a very high probability that the tilt will go negative at the upper temperature limit.

Equalizer 100 is used to provide a means for manual adjustment of the gain response relative to frequency, or tilt, of one or more components in a wideband RF communications system. The equalizer 100 is employed to accurately compensate for unpredictable variations in tilt response of other components within the communications system and thereby obtain a flat overall response. The equalizer 100 also provides a variation in passband tilt relative to temperature to correct for such temperature-related variations in the passband of other components within the communications system. The circuit of equalizer 100 may be implemented as a "bridged-T" equalizer to complement the impedance (e.g., 75 ohms) of the system in which it is designed to operate.

As shown in FIG. 1, the equalizer 100 includes an RF input 105, RF output 110, variable capacitor 115, variable resistor 120, fixed resistors 125, 130, 140, 145, 160, 165, 170, fixed capacitors 135, 155, fixed inductor 150 and a negative coefficient thermistor 175. The RF input 105 receives an RF signal passband from the other components of the communications system, and the RF output 110 outputs a processed (equalized) RF signal passband. The equalizer 100 does not require a power source other than the RF signal received at RF input 105 and is configured to track a change in tilt over temperature in an RF signal passband. For example, the equalizer 100 may operate over a passband having a defined frequency range of approximately 47 MHz to 870 MHz. The equalizer 100 maintains a constant attenuation across the entire passband, as determined by resistors 120, 125, 130, 140, 145, 160, 165, 170 and 175. Variable resistor 120, operating in conjunction with reactive components 115, 135, 150 and 155, may be adjusted such that the attenuation is reduced at the higher frequencies of the passband, thus providing RF signals with desired passband characteristics.

The variable capacitor 115 and variable resistor 120 are part of an alignment circuit used to manually adjust tilt provided by equalizer 100 at a normal temperature. Variable resistor 120 may be manually adjusted to slightly vary the passband tilt of RF signals input into the equalizer 100. Manual alignment is set to an optimum value at a normal temperature. The variable capacitor 115 is used to vary the overall shape of the passband.

The fixed resistors 125 and 130 are incorporated in a limiting circuit used to limit the range of the variable resistor 120 to prevent extreme settings. Using the fixed resistors 125 and 130 in combination with the fixed capacitor 135 allows the overall shape of the response of equalizer 100 relative to frequency to be determined. For example, higher frequencies may be allowed to pass through equalizer 100 with less attenuation than lower frequencies.

The fixed resistors 140 and 145 are incorporated into an impedance circuit which dictates the impedance (e.g., 75 ohms) of the equalizer 100. The fixed inductor 150 and the fixed capacitor 155 are incorporated into a tuning circuit which is resonant at a frequency above the highest operating frequency of equalizer 100 (e.g., 870 MHz). This produces a constant low loss at the highest operating frequency and an accurate response shape of the passband of the RF signal over the defined frequency range of the equalizer.

The fixed resistors 160, 165, 170 and the negative coefficient thermistor 175, together with variable resistor 120 and fixed resistor 125, produce an attenuation value that determines the maximum tilt available from the overall circuit of equalizer 100. The negative coefficient thermistor 175, operating in conjunction with fixed resistors 165 and 170, inversely varies the attenuation to offset variations in passband tilt due to temperature variations. The negative coefficient thermistor 175 has a resistance that varies with temperature to produce a correction for temperature-related passband tilt changes provided by the equalizer 100. Thus, although the environment in which the equalizer resides may vary, the equalizer maintains the same passband characteristics as when the manual alignment is performed. The combination of the thermistor 175, fixed resistor 165 and fixed resistor 170, limit the effect of temperature changes on the thermistor 175, thus providing a precise complement to the temperature coefficient of the component(s) being compensated by equalizer 100.

Suggested values for the above-mentioned components of equalizer 100 are provided in Table 1 below:

TABLE 1

| COMPONENT | VALUE |
| --- | --- |
| variable capacitor 115: | 3-10 pF |
| variable resistor 120: | 0-200 ohms |
| fixed resistor 125: | 20 ohms |
| variable resistor 130: | 100 ohms |
| fixed capacitor 135: | 15 pF |
| fixed resistor 140: | 75 ohms |
| fixed resistor 145: | 75 ohms |
| fixed inductor 150: | 22 nH |
| fixed capacitor 155: | 0.5 pF |
| fixed resistor 160: | 80.6 ohms |
| fixed resistor 165: | 24.9 ohms |
| fixed resistor 170: | 510 ohms |
| thermistor 175: | 100 ohms @ 25° C. |

While this invention has been particularly shown and described with reference to a preferred embodiment, it will be understood by those skilled in the art that various changes in form and details may be made therein without departing from the scope of the invention described hereinabove.

What is claimed is:

1. A temperature compensated variable tilt equalizer configured to operate over a defined frequency range, comprising:

(a) a radio frequency (RF) input for receiving an RF signal having a wide passband;

(b) an automatic temperature compensation circuit having an adjustable compensation range used to correct temperature-related tilt variances that occur on the passband of the RF signal over the defined frequency range;

(c) a manual alignment circuit used to manually adjust tilt of the passband of the RF signal over the defined frequency range, wherein the variable tilt equalizer does not require a power source other than the RF signal; and (d) a limiting circuit for limiting the range of the variable resistor in the manual alignment circuit to prevent extreme settings, wherein the manual alignment circuit includes a variable capacitor coupled to a variable resistor and the limiting circuit includes a first resistor connected in parallel with the variable resistor of the manual alignment circuit, and a second resistor coupled in series with the first resistor and the variable resistor.

2. The temperature compensated variable tilt equalizer of claim 1 wherein the automatic temperature compensation circuit includes a negative coefficient thermistor having a resistance that varies with temperature to produce a correction for temperature-related passband tilt changes provided by the equalizer.

3. The temperature compensated variable tilt equalizer of claim 1 wherein the defined frequency range is approximately 47 MHz to 870 MHz.

4. The temperature compensated variable tilt equalizer of claim 1 wherein manual alignment circuit provides a manual passband tilt adjustment range of approximately 2.0 dB.

5. The temperature compensated variable tilt equalizer of claim 1 further comprising:

(d) a tuning circuit which is resonant at a frequency above the highest operating frequency of the equalizer, the tuning circuit producing a constant low loss at the highest operating frequency and an accurate response shape of the passband of the RF signal over the defined frequency range.

6. The temperature compensated variable tilt equalizer of claim 5 wherein the tuning circuit includes a fixed capacitor connected in parallel with a fixed inductor, one end of the tuning circuit being connected to ground and the other end being connected to the automatic temperature compensation circuit.

7. A temperature compensated variable tilt equalizer configured to operate over a defined frequency range, comprising:
(a) a radio frequency (RF) input for receiving an RF signal having a wide passband;
(b) an automatic temperature compensation circuit having an adjustable compensation range used to correct temperature-related tilt variances that occur on the passband of the RF signal over the defined frequency range;
(c) a variable resistor used to manually adjust tilt of the passband of the RF signal over the defined frequency range; and
(d) a limiting circuit for limiting the range of the variable resistor to prevent extreme settings, wherein the variable tilt equalizer does not require a power source other than the RF signal,
wherein the limiting circuit includes a first resistor connected in parallel with the variable resistor, and a second resistor coupled in series with the first resistor and the variable resistor.

8. The temperature compensated variable tilt equalizer of claim 7 wherein the automatic temperature compensation circuit includes a negative coefficient thermistor having a resistance that varies with temperature to produce a correction for temperature-related passband tilt changes provided by the equalizer.

9. The temperature compensated variable tilt equalizer of claim 7 wherein the defined frequency range is approximately 47 MHz to 870 MHz.

10. The temperature compensated variable tilt equalizer of claim 7 wherein variable resistor provides a manual passband tilt adjustment range of approximately 2.0 dB.

11. The temperature compensated variable tilt equalizer of claim 7 further comprising: (e) a tuning circuit, which is resonant at a frequency above the highest operating frequency of the equalizer, producing a constant low loss at the highest operating frequency and an accurate response shape of the passband of the RF signal over the defined frequency range.

12. The temperature compensated variable tilt equalizer of claim 11 wherein the tuning circuit includes a fixed capacitor connected in parallel with a fixed inductor, wherein one end of the tuning circuit is connected to ground and the other end is connected to the automatic temperature compensation circuit.

13. A temperature compensated variable tilt equalizer configured to operate over a defined frequency range, comprising:
(a) a radio frequency (RF) input for receiving an RF signal having a wide passband;
(b) a negative coefficient thermistor having a resistance that varies with temperature to produce a correction for temperature-related passband tilt changes provided by the equalizer;
(c) a variable resistor used to manually adjust tilt of the passband of the RF signal over the defined frequency range;
(d) a tuning circuit, which is resonant at a frequency above the highest operating frequency of the equalizer, producing a constant low loss at the highest operating frequency and an accurate response shape of the passband over the defined operating range: and
(e) a limiting circuit for limiting the range of the variable resistor to prevent extreme setting,
wherein the variable tilt equalizer does not require a power source other than the RF signal and the limiting circuit includes a first resistor connected in parallel with the variable resistor, and a second resistor coupled in series with the first resistor and the variable resistor.

14. The temperature compensated variable tilt equalizer of claim 13 wherein the tuning circuit includes a fixed capacitor connected in parallel with a fixed inductor, wherein one end of the tuning circuit is connected to ground and the other end is connected to the negative coefficient thermistor.

15. The temperature compensated variable tilt equalizer of claim 13 wherein the defined frequency range is approximately 47 MHz to 870 MHz.

16. The temperature compensated variable tilt equalizer of claim 13 wherein variable resistor provides a manual passband tilt adjustment range of approximately 2.0 dB.

* * * * *